US006479195B1

(12) United States Patent
Kirchauer et al.

(10) Patent No.: US 6,479,195 B1
(45) Date of Patent: Nov. 12, 2002

(54) MASK ABSORBER FOR EXTREME ULTRAVIOLET LITHOGRAPHY

(75) Inventors: Heinrich Kirchauer, Munich (DE); Pei-Yang Yan, Saratogo, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/662,055

(22) Filed: Sep. 15, 2000

(51) Int. Cl.[7] .............................. G03F 9/00; H01L 21/30
(52) U.S. Cl. ............................................. 430/5; 378/35
(58) Field of Search ........................ 430/5, 322; 378/34, 378/35

(56) References Cited

U.S. PATENT DOCUMENTS 5,889,758 A * 3/1999 Maehara et al. ............... 378/35
6,178,221 B1 * 1/2001 Levinson et al. .............. 378/35

* cited by examiner

Primary Examiner—S. Rosasco
(74) Attorney, Agent, or Firm—George Chen (57) ABSTRACT

The present invention discloses a reflective mask for Extreme Ultraviolet Lithography to produce tight CD control on a wafer and a process for fabricating such a mask. In one embodiment, the upper corners of the edges of the absorber layer are rounded or smooth. In another embodiment, the upper surface of the absorber layer is rough. In a further embodiment, an antireflective coating is disposed on the absorber layer.

16 Claims, 5 Drawing Sheets

MASK ABSORBER FOR EXTREME ULTRAVIOLET LITHOGRAPHY

BACKGROUND OF THE INVENTION

1. Field of the Invention

The present invention relates to the field of semiconductor integrated circuit manufacturing, and more specifically, to a mask and a method of fabricating a mask used in extreme ultraviolet lithography (EUVL).

2. Discussion of Related Art

Continual improvement in photolithography has allowed the shrinkage of semiconductor integrated circuits (IC) to achieve ever higher density and performance. Deep ultraviolet (DUV) light with a wavelength of 248, 193, or 157 nanometers may be used for optical lithography. However, a paradigm shift to more exotic technologies is inevitable. Viable contenders for Next Generation Lithography (NGL) include electron projection lithography (EPL), ion projection lithography (IPL), x-ray projection lithography (XPL), and extreme ultraviolet lithography (EUVL).

Figure 1:
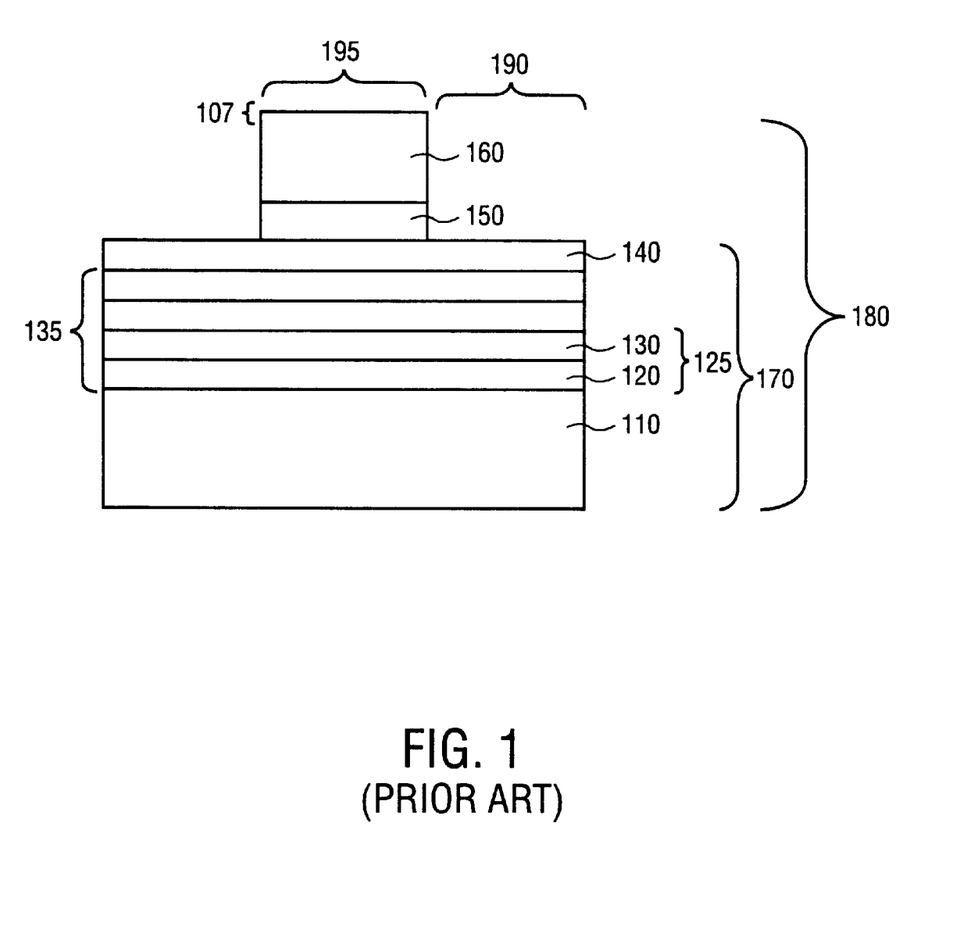
FIG. 1 is an illustration of a cross-sectional view of a mask with an absorber layer having edges with upper corners that are sharp (prior art).

EUVL is a leading candidate for NGL, especially for fabrication of high volume ICs. Exposure is performed with extreme ultraviolet (EUV) light with a wavelength of about 10–15 nanometers. EUV light falls in a portion of the electromagnetic spectrum referred to as soft x-ray (2–50 nanometers). Whereas a conventional mask used in DUV lithography is made from fused quartz and is transmissive, virtually all condensed materials are highly absorbing at the EUV wavelength so a reflective mask 180, as shown in FIG. 1, is required for EUVL.

An EUV step-and-scan tool typically uses a 4X-reduction projection optical system. A wafer is exposed by stepping fields across the wafer and scanning an arc-shaped region of the EUV mask for each field. The EUV step-and-scan tool may have a 0.10 Numerical Aperture (NA) with 4 imaging mirrors and 2 collection mirrors. A critical dimension (CD) of 50–70 nanometers may be achieved with a depth of focus (DOF) of about 1 micrometer. Alternatively, the tool may have a 0.25 NA with 6 imaging mirrors to print a smaller CD, such as 20–30 nanometers, but the DOF will be decreased significantly. Other tool designs, including 5X, 6X, and 10X reduction, may be used.

Figure 6:
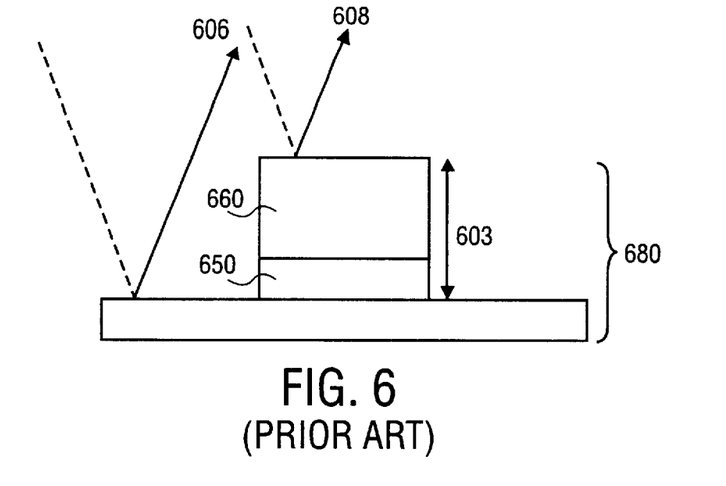
FIG. 6 is an illustration of light reflected off a mask with an absorber layer having edges with upper corners that are sharp (prior art).

The variability in CD printed on a wafer with EUV lithography depends strongly on the absorber height 603 on the EUV mask 680, as shown in FIG. 6. An oscillating relationship results from interference between the light 606 reflected off the multilayer (ML) mirror within the blank areas of the mask 680 and the light 608 reflected off the upper surface of the mask absorber. The phase difference between the principal light rays oscillates with half the wavelength of the incident light. Constructive and destructive interference occurs for absorber heights 603 differing by only a quarter of a wavelength or about 3 nanometers. Such a variation in absorber height 603 of 3 nanometers will cause CD on a wafer to vary by approximately 4 nanometers.

Wafer CD variation can potentially be minimized by controlling the variation in the thickness of the mask absorber 660 within the entire mask 680 to less than 3 nanometers. However, existing deposition tools are not able to deliver such a tight uniformity for the thickness of the mask absorber 660.

Thus, what is needed is a reflective EUV mask to produce tight CD control on a wafer and a process for fabricating such a reflective mask.

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention is a reflective mask for Extreme Ultraviolet (EUV) Lithography (EUVL) to produce tight CD control on a wafer and a process for fabricating such a mask. Various embodiments of the reflective mask according to the present invention will be described first. In one embodiment, the upper corners of the edges of the absorber layer are rounded or smooth. In another embodiment, the upper surface of the absorber layer is rough. In a further embodiment, an antireflective coating is disposed on the absorber layer.

Figure 2:
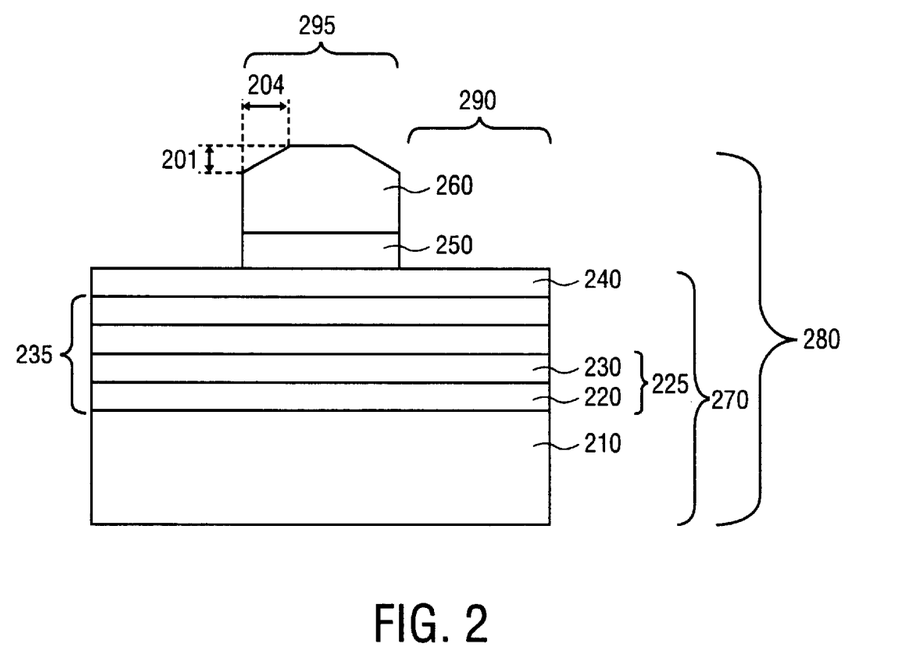
FIG. 2 is an illustration of a cross-sectional view of a mask with an absorber layer having edges with upper corners that are rounded or smooth.

FIG. 2 shows a first embodiment of an EUV mask 280 according to the present invention. An EUV mask 280 operates on the principle of a distributed Bragg reflector. A substrate 210 supports a multilayer (ML) mirror 235 of 20–80 pairs 225 of alternating layers of two materials. The two materials have different refractive indices. In order to maximize the difference in electron density, one material 220 has a high atomic number (Z) while the other material 230 has a low Z. The high-Z material 220 acts as a scattering layer at the illumination wavelength and should be as thin as possible. The low-Z material 230 acts as a spacing layer and should have minimal absorption at the illumination wavelength.

Selection of the appropriate materials and thicknesses for the ML mirror 235 allows the reflected light to add in phase. For example, Molybdenum (Mo) has a Z of 42 while Silicon (Si) has a Z of 14. In order to achieve a resonant reflectivity, the period of each pair 225 in the ML mirror 235 should be approximately half of the illumination wavelength. For an EUV wavelength of 13.4 nanometers, the pair 225 may be formed from about 2.7 nanometers thick Mo and about 4.0 nanometers thick Si. The constructive interference results in a peak normal incidence reflectance of about 60–75% at about 13.4 nanometers. The bandwidth of the light reflected off the ML mirror 235 is about 1.0 nanometer and becomes narrower as the number of layers increases. Both reflectance and phase shift saturate beyond about 30–40 pairs 225. The reflectance is relatively flat for an angle of incidence of less than 8 degrees from normal.

Reflectance can be degraded by layer intermixing, interface roughness, and surface oxidation of the ML mirror 235. Layer intermixing is minimized by keeping the processing temperature below 150 degrees C. Otherwise, excessive heating may lead to chemical reactions at the interfaces between the multilayers. The periodicity of the multilayer 235 may also be affected.

Interface roughness is strongly influenced by the substrate 210 of the EUV mask 280. The surface roughness of the substrate 210 should be maintained at less than 0.1 nanometer root mean squared (RMS).

Molybdenum will oxidize upon exposure to the atmosphere so a capping layer 240 of a low atomic number material 230, such as 4.0 nanometers thick Si, is usually formed over the upper surface of the ML mirror 235. The reflectance of the ML mirror 235 should remain stable for at least 5 years in order to achieve acceptable throughput and cost of ownership (CoO).

If desired, Beryllium, with a Z of 4, may be used instead of Silicon. An ML mirror 235 comprising pairs 225 of alternating layers of Molybdenum and Beryllium (Mo/Be) can achieve a higher reflectance at about 11.3 nanometers. However, both Mo and Be will oxidize so a capping layer 240 can be formed from another material that will remain chemically stable within the environment of the step-and-scan tool.

Alternatively, Ruthenium, with a Z of 44, may be used together with Molybdenum for the high Z material. An ML mirror 235 comprising pairs 225 of alternating layers of Molydenum-Ruthenium and Beryllium (MoRu/Be) has less intrinsic stress than Mo/Be.

The EUV mask 280 is patterned into a first region 290 and a second region 295. The first region 290 of the EUV mask 280 is reflective because the ML mirror 235 is uncovered. The second region 295 of the EUV mask 280 is not reflective since the ML mirror 235 is covered with a buffer layer 250 and an absorber layer 260. EUV light is obliquely incident on an EUV mask 280 during use so it is desirable for the buffer layer 250 and the absorber layer 260 to be thin. Otherwise, a shadowing effect may affect size and placement of features in the pattern.

The buffer layer 250 has a thickness of about 35–105 nanometers. The buffer layer 250 acts as an etch stop layer for patterning of the absorber layer 260. The buffer layer 250 also serves as a sacrificial layer for focused ion beam (FIB) repair of defects in the absorber layer 260.

The absorber layer 260 has a thickness of about 45–215 nanometers. The absorber layer 260 absorbs light at the illumination wavelength for which the EUV mask 280 is to be used.

Increasing the thickness of the absorber layer 260 shifts the "dark edge" and results in a larger variation of the feature width. Increasing the thickness of the absorber layer 260 also increases the asymmetry that is inherent in an EUV mask 280 due to oblique illumination. Consequently, it is desirable to use a thinner absorber layer 260 formed from a material with a larger absorption coefficient. Another consideration is that the contrast between the ML mirror 235 and the absorber layer 260 should be sufficient to facilitate linewidth measurement and defect inspection.

In a first embodiment of the present invention, the upper corners of the edges of the absorber layer 260 are rounded or smooth so the strict phase correlation between the reflected light off the ML mirror 235 within the first region 290 and the reflected light off the upper surface of the absorber 260 within the second region 295 is relaxed. See FIG. 2 and FIG. 7.

Figure 7:
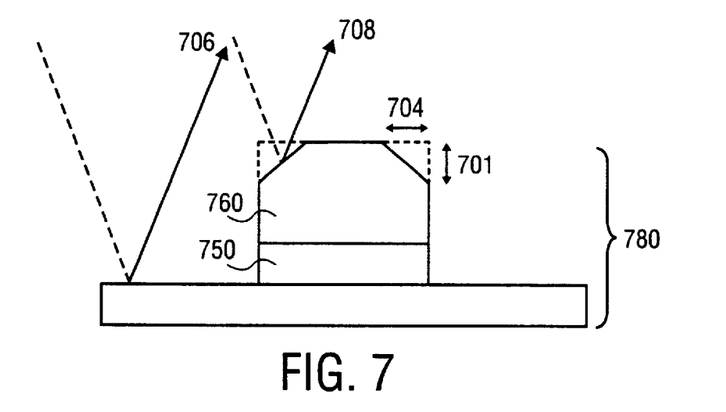
FIG. 7 is an illustration of light reflected off a mask with an absorber layer having edges with upper corners that are rounded or smooth.

The rounded or smooth corners have a vertical height 201 and a lateral width 204. The absorber 260 is relatively thin so the vertical height 201 is limited to a narrow range of values. However, the absorber 260 is relatively wide so the lateral width 204 of the rounded corner can be varied over a large range to reduce the peak-to-valley variation to below 1 nanometer. Thus, CD variation can be significantly reduced across a wafer.

Figure 3:
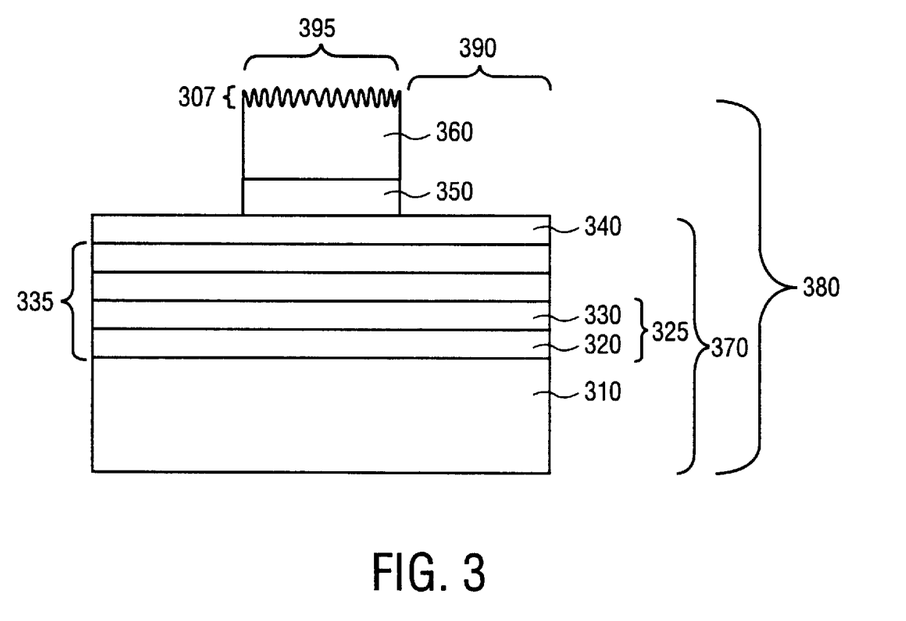
FIG. 3 is an illustration of a cross-sectional view of a mask with an absorber layer having an upper surface that is rough.
Figure 8:
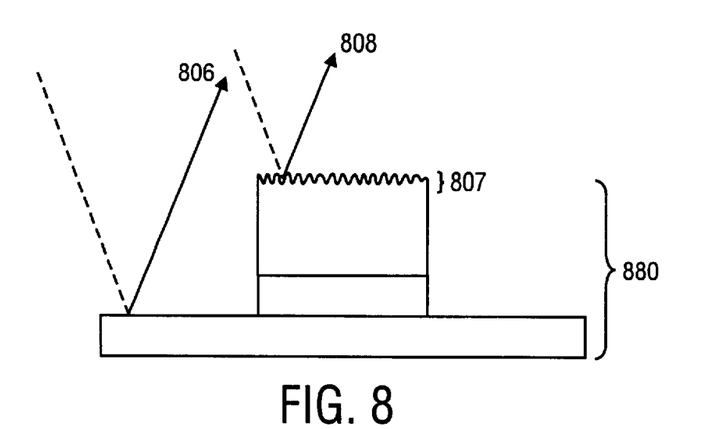
FIG. 8 is an illustration of light reflected off a mask with an absorber layer having an upper surface that is rough.

FIG. 3 shows a second embodiment of an EUV mask 380 according to the present invention. In the second embodiment, the upper surface 307 of the absorber 360 is rough so the strict phase correlation between the reflected light off the ML mirror 335 within the first region 390 and the reflected light off the upper surface 307 of the absorber 360 within the second region 395 is relaxed in a more random way. See FIG. 3 and FIG. 8. The upper surface 307 of the absorber 360 may have a roughness of about 2–15 nanometers root mean squared (RMS).

In a third embodiment (not shown), the absorber layer of the EUV mask may be further covered with an anti-reflective coating (ARC). An ARC used for deep ultraviolet (DUV) lithography may be formed from a refractory metal nitride that was deposited using sputtering or chemical vapor deposition (CVD). An ARC used for EUV should have an index of refraction that is sufficiently different from the underlying absorber layer such that selection of the appropriate thicknesses would allow destructive interference to reduce reflection.

If desired, two or more of the embodiments described above may be combined. For example, the upper corners of the edges of the absorber layer may be rounded or smooth (similar to the first embodiment) and the upper surface of the absorber may be rough (similar to the second embodiment).

A process for fabricating a reflective EUV mask 480 to produce tight CD control on a wafer will be described next in FIGS. 4(a)–(g).

Figure 4A:
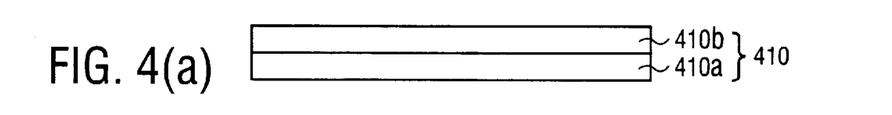
FIGS. 4(a)–(g) is an illustration of a process to fabricate a mask with an absorber layer having edges with upper corners that are rounded or smooth.

FIG. 4(a) shows a robust substrate 410 with a flat and smooth surface. An EUV mask 280 is usually used with an angle of incidence that is about 5 (+/−1.5) degrees off normal. Such non-telecentric illumination of the EUV mask 280 may cause a change in apparent linewidth and apparent location of the features on the wafer if the EUV mask 280 is not sufficiently flat. The partial coherence of the illumination may change the linwidth variation, but does not affect the pattern shift.

A 200-millimeter diameter Silicon (Si) wafer 410A may be used as the substrate. A low defect level and a smooth surface may be obtained by depositing 1–4 micrometers of epitaxial silicon 410B on a polished wafer 410A that has been intentionally oriented less than 1 degree away from the (100) crystallographic direction.

Silicon has a large coefficient of thermal expansion (CTE) which may cause undesirable image displacement of the features printed. However, Silicon also has high thermal conductivity, so it is a viable substrate if heat can be removed efficiently from the EUV mask 480 during exposure. Otherwise, it would be preferable to use a glass or glass-ceramic substrate with a low coefficient of thermal expansion (CTE) so as to minimize image displacement error when the mask is illuminated during printing. An example of a low CTE glass is ULE® which is composed of amorphous Silicon Dioxide (SiO2) doped with about 7% Titanium Dioxide ($TiO_2$). ULE is a registered trademark of Corning, Inc, USA. An example of a low CTE glass-ceramic is Zerodur®. Zerodur is a registered trademark of Schott Glaswerk GmbH, Germany.

Figure 4B:
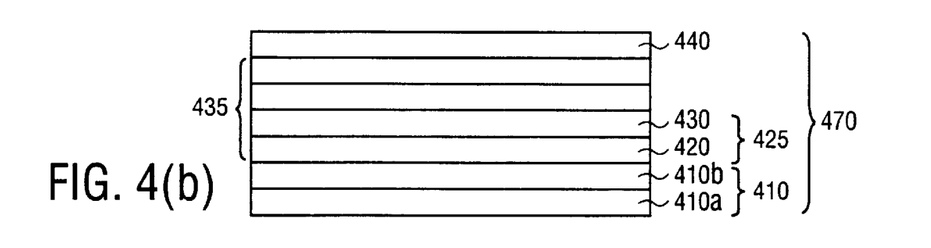

FIG. 4(b) shows a mask blank 470 with a multilayer (ML) mirror 435 of 20–80 pairs 425 of alternating layers of two materials to achieve a high reflectance at an illumination wavelength of about 13.4 nanometers. The reflective material 420 is usually formed from about 2.7 nanometers thick Molybdenum (Mo). The transmissive material 430 is usually formed from about 4.0 nanometers thick Silicon (Si).

The ML mirror 435 is formed on the substrate 410 using ion beam deposition (IBD) or DC magnetron sputtering. The thickness uniformity should be better than 0.8% across a substrate 410 formed from a 200 mm Silicon wafer 410A.

Ion beam deposition results in fewer defects at the upper surface of the ML mirror 435 because any defect on the substrate 410 below tends to be smoothened over during the alternating deposition from elemental targets. As a result, the upper layers of the multilayer mirror 435 are perturbed less.

DC magnetron sputtering is more conformal, thus producing better thickness uniformity, but any defect on the substrate 410 also tends to propagate up through the multilayer mirror 435 to the upper surface.

Figure 4C:
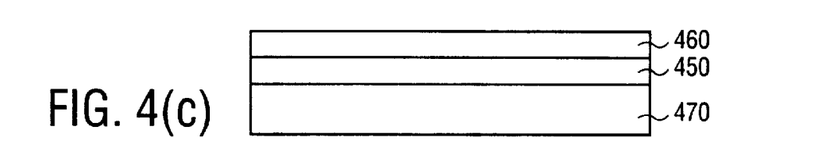
Figure 4D:
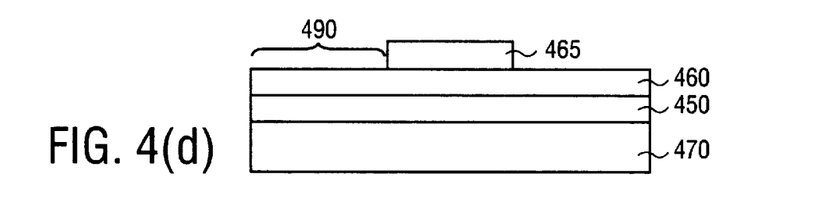
Figure 4E:
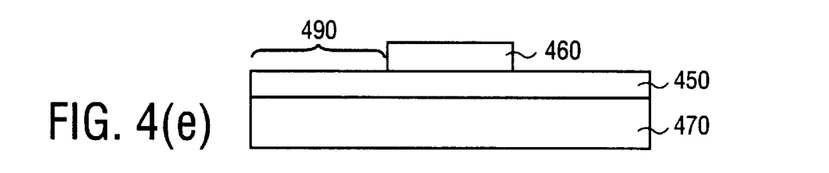
Figure 4F:
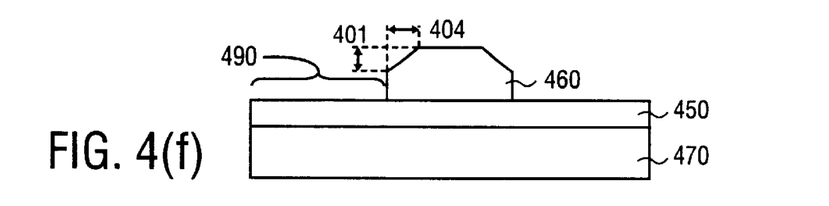
Figure 4G:
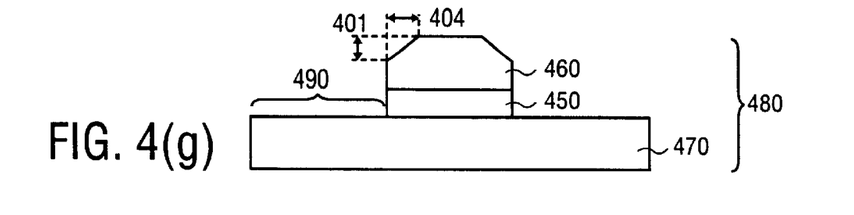

It is not practical to repair the reflective regions 490, as shown in FIG. 4(g), of the ML mirror 435 so the mask blank 470 must be essentially free of defects. Defects in the mask blank 470 which affect magnitude or phase of the reflected EUV may result in undesirable printing of defects. For example, for the 100 nanometer device node, the defect density should be less than $0.01/cm^2$ for defects larger than 80 nanometers in size on a 4X reduction mask. Any defect should be kept more than about 40–60 pairs 425 of layers from the upper surface of the ML mirror 435 in order to decrease the likelihood of printing the defect on the wafer. The contrast of the photoresist 465 used also plays a large role in determining which defects on the EUV mask 480 will print on the wafer.

Both the reflective material 420 and the transmissive material 430 in the ML mirror 435 are mostly amorphous or partially polycrystalline. The interfaces should remain chemically stable during mask fabrication and during mask usage. Minimal interdiffusion should occur at the interfaces. The optical properties of the ML mirror 435 are optimized when individual layers are smooth, transitions between different materials are abrupt, and thickness variation across layers is less than 0.01 nanometer.

A capping layer 440 may be used to protect the ML mirror 435 in the mask blank 470. Optimizing a ML mirror 435 for maximum reflectance may lead to a compressive stress of about –350 MPa which is sufficient to distort the ML mirror 435 at the Angstrom level. The deformation induced by stress may be decreased by annealing the multilayers or by adding a buffer layer 450 below the multilayers when fabricating an EUV mask 480 from a mask blank 470.

FIG. 4(c) shows a buffer layer 450 of about 35–105 nanometers that is deposited on the mask blank 470. The buffer layer 450 may be formed from Silicon Dioxide ($SiO_2$). Low temperature oxide (LTO) is often used to minimize process temperature, thus reducing interdiffusion of the materials in the ML mirror 435. Other materials with similar properties may be selected for the buffer layer 450, such as silicon oxynitride (SiOxNy). The buffer layer 450 may be deposited by RF magnetron sputtering. If desired, a layer of amorphous Silicon or Carbon (not shown) may be deposited prior to deposition of the buffer layer 450.

FIG. 4(c) also shows an absorber layer 460 of about 45–215 nanometers that is deposited on the buffer layer 450. The absorber layer 460 may be deposited with DC magnetron sputtering. The absorber layer 460 may be formed from various materials. The absorber layer 460 must attenuate EUV light, remain chemically stable during exposure to EUV light, and be compatible with the mask fabrication process.

Various metals and alloys may be suitable for forming the absorber layer 460. Eaxmples include Aluminum (Al), Aluminum-Copper (AlCu), Chromium (Cr), Tantalum (Ta), Titanium (Ti), and Tungsten (W). In certain cases, it may be desirable to form the absorber layer 460 entirely or partially out of carbides, nitrides, or silicides of some metals. Examples include Nickel Silicide (NiSi), Tantalum Boride (TaB), Tantalum Nitride (TaN), Tantalum Silicide (TaSi), Tantalum Silicon Nitride (TaSiN), and Titanium Nitride (TiN).

FIG. 4(d) shows photoresist 465 that is coated, exposed, and developed to create the desired feature. The photoresist 465 has a thickness of about 160–640 nanometers. As appropriate, a chemically amplified resist (CAR) may be used. Deep ultraviolet (DUV) light or an electron beam (e-beam) may be used to pattern the features in the photoresist 465.

After measurement of the linewidth of the features in the photoresist 465, the pattern is transferred from the photoresist 465 into the absorber layer 460 as shown in FIG. 4(e). Reactive ion etch (RIE) may be used. For example, a Tantalum (Ta) absorber layer 460 may be dry etched with a gas which contains Chlorine, such as $Cl_2$ and $BCl_3$. In some cases, Oxygen ($O_2$) may be included. The etch rate and the etch selectivity depend on power, pressure, and substrate temperature. The buffer layer 450 serves as an etch stop layer to produce a good etch profile in the overlying absorber layer 460. The buffer layer 450 also protects the underlying ML mirror 435 from etch damage.

After removing the photoresist 465, the linewidth and the accuracy of placement of the features patterned in the absorber layer 460 are measured. Then, defect inspection is done and defect repair of the absorber layer 460 is performed as needed. The buffer layer 450 further serves as a sacrificial layer for focused ion beam (FIB) repair of defects in the absorber layer 460.

The upper corners of the edges of the absorber layer 460 are rounded or smoothened as shown in FIG. 4(f). A dry etch may be used.

The buffer layer 450 increases diffraction in the multilayer when the EUV mask 480 is used. The resulting reduction in contrast can slightly degrade CD control of the features printed on a wafer. Consequently, the buffer layer 450 should be removed by dry etch or wet etch or a combination of the two processes as shown in FIG. 4(g). For example, the buffer layer 450 may be dry etched with a gas which contains Fluorine, such as $CF_4$ or $C_4F_8$. Oxygen ($O_2$) and a carrier gas, such as Argon (Ar), may be included.

The buffer layer 450 may be wet etched if it is very thin since any undercut of the absorber layer 460 would then be small. For example, a buffer layer 450 formed from Silicon Dioxide may be etched with an aqueous solution of about 3–5% hydrofluoric (HF) acid. The dry etch or wet etch selected to remove the buffer layer 450 must not damage the absorber layer 460, the capping layer 440, or the ML mirror 435.

FIGS. 5(a)–(e) show an embodiment to form a mask with an absorber layer 560 which has a rough upper surface 507.

Figure 5A:
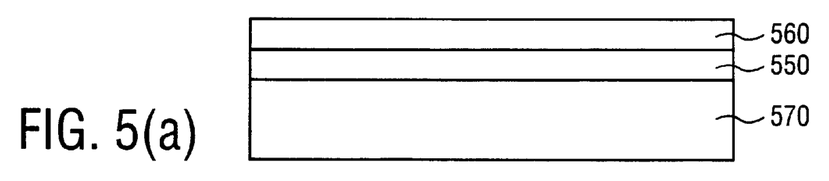
FIGS. 5(a)–(e) is an illustration of a process to fabricate a mask with an absorber layer having an upper surface that is rough.

FIG. 5(a) shows a mask blank 570 that is coated with a buffer layer 550 and an absorber layer 560.

Figure 5B:
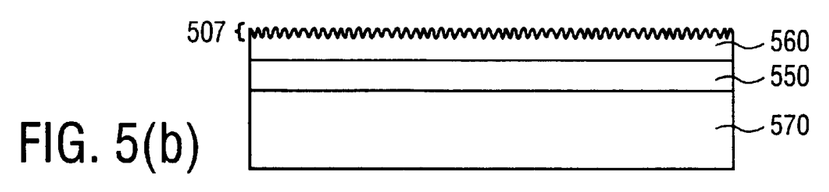

A dry etch or a wet etch or a combination is used to roughen the upper surface 507 of the absorber layer 560 as shown in FIG. 5(b). The roughening process depends on the materials and thicknesses selected for the absorber layer 560 and the underlying buffer layer 550. Some possible dry etches may include $CF_4$, $CCl_4$, and $Cl_2/O_2$.

Figure 5C:
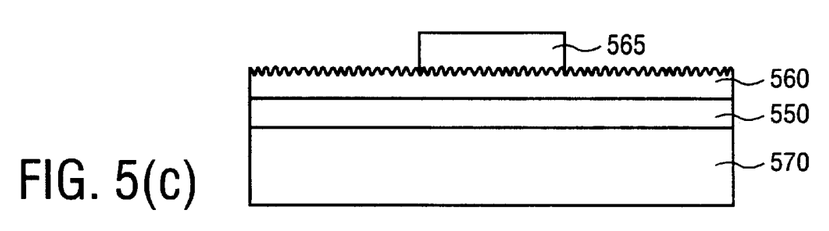

Wet etches to roughen the upper surface 507 of the absorber layer 560 may be performed with solutions diluted with water. Depending on the material forming the absorber layer 560, such aqueous solutions may contain certain acids, oxidizing agents, and other chemicals. Examples include HF, HCl, $HNO_3$, $H_2SO_4$, $NH_4F$, and $H_2O_2$. Alkaline solutions may be used to etch other materials FIG. 5(c) shows the patterning of photoresist 565.

Figure 5D:
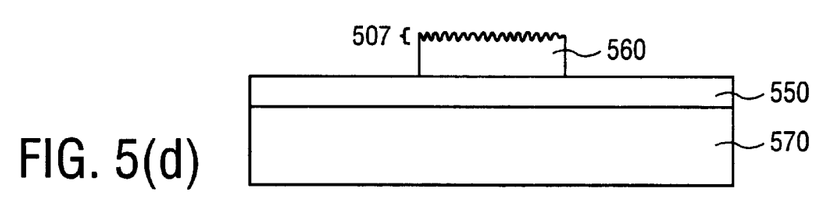

FIG. 5(d) shows the transfer of the pattern from the photoresist 565 into the absorber layer 560. A dry etch may be used.

Figure 5E:
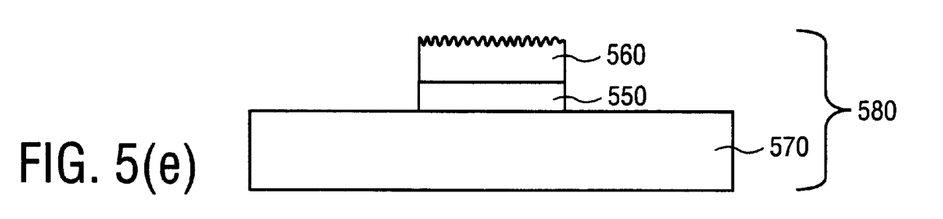

FIG. 5(e) shows the removal of the buffer layer 550 from the areas of the mask 580 where the absorber layer 560 has already been removed.

If desired, it is possible (not shown) to essentially combine the processes shown in FIG. 4 and FIG. 5.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a reflective mask to produce tight CD control on a wafer and a process for fabricating such a reflective mask.

We claim:

1. A method of fabricating a mask for photolithography comprising:

providing a substrate;

forming a multilayer on said substrate, said multilayer comprising:

alternating layers of a first material and a second material, said first material having a high atomic number and said second material having a low atomic number;

forming a third material over said multilayer, said third material comprising a metal;

patterning said third material into a first region and a second region;

removing said third material in said first region; and smoothening upper corners of edges of said third material in said second region.

2. The method of claim 1 wherein a capping layer is further formed on said multilayer in said first region and said second region.

3. The method of claim 1 wherein a buffer layer is further formed on said multilayer below said third material in said second region.

4. The method of claim 1 wherein an antireflective coating is further formed on said third material in said second region.

5. A method of fabricating a mask for photolithography comprising:

providing a substrate;

forming a mirror on said substrate, said mirror comprising;

alternating layers of a reflective material and a transmissive material; forming an absorber layer over said mirror, said absorber layer having an upper surface; roughening said upper surface of said absorber layer;

patterning said absorber layer into a first region and a second region; and uncovering said mirror in said first region.

6. The method of claim 5 wherein a capping layer is further formed on said mirror in said first region and said second region.

7. The method of claim 5 wherein a buffer layer is further formed on said mirror below said absorber layer in said second region.

8. The method of claim 5 wherein an antireflective coating is further formed on said absorber layer in said second region.

9. A mask for photolithography comprising:

a substrate;

a multilayer disposed on said substrate, said multilayer being reflective, said multilayer having a first region and a second region; and an absorber layer disposed on said second region of said multilayer, said absorber layer having edges with upper corners that are rounded or smooth.

10. The mask of claim 9 wherein a capping layer is further disposed on said multilayer in said first region and said second region.

11. The mask of claim 9 wherein a buffer layer is further disposed on said multilayer below said absorber layer in said second region.

12. The mask of claim 9 wherein an antireflective coating is further disposed on said absorber layer in said second region.

13. A mask for photolithography comprising:

a substrate;

a multilayer disposed on said substrate, said multilayer being reflective, said multilayer having a first region and a second region; and an absorber layer disposed on said second region of said multilayer, said absorber layer having an upper surface that is rough.

14. The mask of claim 13 wherein a capping layer is further disposed on said multilayer in said first region and said second region.

15. The mask of claim 13 wherein a buffer layer is further disposed on said multilayer below said absorber layer in said second region.

16. The mask of claim 15 wherein an antireflective coating is further disposed on said absorber layer in said second region.

* * * * *

UNITED STATES PATENT AND TRADEMARK OFFICE
CERTIFICATE OF CORRECTION

PATENT NO. : 6,479,195 B1
DATED : November 12, 2002
INVENTOR(S) : Kirchauer et al.

It is certified that error appears in the above-identified patent and that said Letters Patent is hereby corrected as shown below:

<u>Column 2,</u>
Lines 4, 7 and 40, delete "comers", insert -- corners --.

<u>Column 4,</u>
Lines 8 and 38, delete "comers", insert -- corners --.

Signed and Sealed this

Eighth Day of April, 2003

JAMES E. ROGAN
*Director of the United States Patent and Trademark Office*